US 6,700,311 B2

(12) United States Patent
Hammer et al.

(10) Patent No.: US 6,700,311 B2
(45) Date of Patent: Mar. 2, 2004

(54) PIEZOELECTRIC CERAMIC BODY HAVING SILVER-CONTAINING INTERNAL ELECTRODES

(75) Inventors: Marianne Hammer, Stuttgart (DE); Friederike Lindner, Gerlingen (DE); Petra Kuschel, Renningen (DE)

(73) Assignee: Robert Bosch GmbH, Stuttgart (DE)

(*) Notice: Subject to any disclaimer, the term of this patent is extended or adjusted under 35 U.S.C. 154(b) by 309 days.

(21) Appl. No.: 09/782,087

(22) Filed: Feb. 12, 2001

(65) Prior Publication Data

US 2001/0054859 A1 Dec. 27, 2001

(30) Foreign Application Priority Data

Feb. 12, 2000 (DE) .......................... 100 06 352

(51) Int. Cl.[7] .............................................. H01L 41/08
(52) U.S. Cl. ...................................................... 310/363
(58) Field of Search .................................. 310/363, 364

(56) References Cited

U.S. PATENT DOCUMENTS

| 4,845,399 | A | * | 7/1989 | Yasuda et al. | ............... 310/328 |
| 5,163,209 | A | * | 11/1992 | Harada et al. | ............... 29/25.35 |
| 5,196,757 | A | * | 3/1993 | Omatsu | ....................... 310/328 |
| 5,233,260 | A | * | 8/1993 | Harada et al. | ............... 310/328 |
| 5,245,734 | A | * | 9/1993 | Issartel | ....................... 29/25.35 |
| 5,523,645 | A | * | 6/1996 | Inoi | ........................... 310/328 |
| 6,232,701 | B1 | * | 5/2001 | Schuh et al. | ................ 310/328 |
| 2001/0026114 | A1 | * | 10/2001 | Takao et al. | ................ 310/364 |

FOREIGN PATENT DOCUMENTS

| DE | 199 51 016 |   | 5/2001 |   |
| JP | 01184968 A | * | 7/1989 | ............ H01L/41/08 |
| JP | 06350377 A | * | 12/1994 | ......... H03H/9/145 |
| JP | 09162682 A | * | 6/1997 | ............ H03H/9/17 |
| JP | 11186625 A | * | 7/1999 | ......... H01L/41/083 |

* cited by examiner

Primary Examiner—Mark Budd
(74) Attorney, Agent, or Firm—Kenyon & Kenyon

(57) ABSTRACT

A piezoelectric ceramic body includes a multiplicity of insulating layers, arranged one on top of the other, made of a piezoactive ceramic material, the insulating layers being separated from each other at least in areas by internal electrodes, of which at least one has a silver-containing material at least in areas. The material of the silver-containing internal electrode furthermore has a component reducing or inhibiting the diffusion of silver from the internal electrodes into an insulating layer, in particular a ceramic component on the basis of a PZT ceramic.

9 Claims, 1 Drawing Sheet

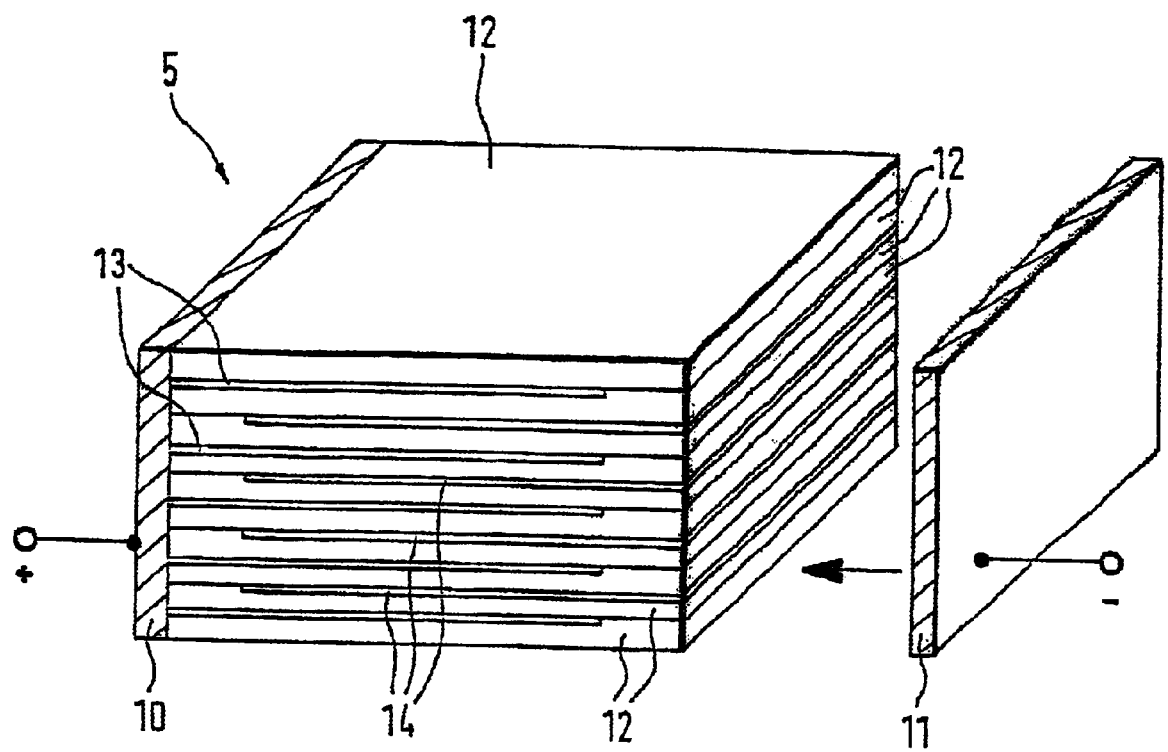

PIEZOELECTRIC CERAMIC BODY HAVING SILVER-CONTAINING INTERNAL ELECTRODES

FIELD OF THE INVENTION

The present invention relates to a piezoelectric ceramic body having at least one silver-containing internal electrode.

BACKGROUND INFORMATION

Ceramic piezoactuators are widely known that are composed of a multiplicity of thin, ceramic piezoactive layers, each of which being separated from the others by an internal electrode layer, via which they can be electrically contacted and driven (see, e.g., German Patent Application No. 199 51 016.4).

Piezoactuators of this type are essentially composed, for example, of a PZT ceramic, i.e., $Pb(Ti_xZr_{1-x})O_3$ where $0.4<x<0.6$ in the form of a multiplicity of ceramic piezoactive layers made of this PZT ceramic, sintered together, which can be electrically driven in a defined manner by internal electrodes, mounted in between, and which, as a result of the inverse piezoeffect, undergo an expansion or compression in response to the application of an external voltage. In typical driving voltages of 100 to 300 V, this alteration in length is in the range of 0.1 to 0.3%.

The internal electrodes in piezoelectric ceramic bodies must, on the one hand, be made of materials whose melting point is higher than the temperatures necessary for sintering the ceramics. In addition, the materials of the internal electrodes must be oxidation-stable, because the sintering of the insulating layers acting as actuators, and therefore of the entire piezoelectric ceramic body is carried out in the presence of oxygen or air. In order to assure this oxidation-stability, rare metals or rare-metal alloys are usually used as the materials for the internal electrodes.

One internal-electrode material frequently used is platinum, which, however, is very expensive, so that silver-palladium alloys are often substituted, which have a typical composition of 70 percentage by mass silver and 30 percentage by mass palladium. This composition assures a melting point that is sufficiently high for the sintering.

One disadvantage in using silver in the internal electrodes is the fact that, during sintering in a co-firing process, the result can be a diffusion of silver from the electrodes into the neighboring insulating layers. This leads to an undesirable influencing of the electromechanical properties of the piezoelectric ceramic body, because the diffusing silver is incorporated, for example, on the Pb locations of the PZT piezoceramic. A further disadvantage in this undesirable diffusion is that when large quantities of silver are diffused into the PZT ceramic, after a silver saturation has been reached, silver secondary phases form, thus reducing the specific electrical resistance of the otherwise electrically insulating PZT material. The result can be undesirable electrical breakdowns.

Finally, a disadvantage of the known silver-palladium alloys as the internal-electrode material is that the proportion of palladium at approximately 30 percent by mass is still relatively high, which also makes this internal-electrode material relatively expensive. However, an undesirable reduction in the palladium content results in a further increase in the silver content, which even further increases the aforementioned disadvantages due to the undesirable diffusion effects.

SUMMARY OF THE INVENTION

In contrast to the related art, the piezoelectric ceramic body according to the present invention has the advantage that a diffusion of silver from the internal electrodes into the neighboring insulating layers is reduced or suppressed. Thus the silver added to the internal-electrode material essentially remains in the electrode, so that the negative influencing of the properties of the piezoelectric ceramic material, for example a PZT ceramic, by the diffusion of the silver is significantly reduced.

It is especially advantageous if the component of the internal-electrode material reducing or inhibiting the diffusion of silver is a ceramic component, especially a piezoelectric ceramic component such as PZT ceramic. In this way, it is possible to adapt in a simple manner the mechanical properties of the material of the internal electrode, especially with regard to temperature behavior and thermal expansion, to the neighboring insulating layers, which usually are made of PZT ceramics. Furthermore, in this manner, the adhesion between the internal electrodes and the neighboring insulating layers is improved.

Altogether, a reduction in the production of waste in the manufacturing process is therefore brought about, because the above-mentioned effects suppress the occurrence of delaminations or cracks in the generated piezoelectric ceramic body during and after the sintering.

In addition, it is advantageous if the proportion of the component reducing or inhibiting the diffusion of silver does not exceed 50 percent by volume, with respect to the entire volume of the material of the internal electrode. In this manner, it is assured that a sufficiently high electrical conductivity of the internal electrodes is always maintained.

The optimal value for the proportion of the component reducing or inhibiting the diffusion of silver, for example the added PZT ceramic, can be established by the worker skilled in the art for an individual case on the basis of simple preliminary tests, because this proportion is highly dependent on the particle sizes of the metallic and ceramic powders used for manufacturing the insulating layers and the internal electrodes.

Furthermore, it has proven to be very advantageous if the component of the internal-electrode material reducing or inhibiting the diffusion of silver also contains rare-earth metals such as lanthanum or neodymium, subgroup elements such as niobium, alkali metals such as lithium, sodium, or potassium, or alkaline-earth metals such as strontium. These metals have a favorable influence on the characteristic physical sizes of the piezoelectric multilayer actuator generated and can be added both to the insulating layers as well as to the material of the internal electrodes.

The rare-earth metals, the subgroup elements, the alkali metals, and/or the alkaline-earth metals are preferably added to the material of the insulating layers in the form of a dopant having a content of less than 8 mol %, preferably less than 5 mol %, with respect to the material of the internal electrode and of the insulating layer.

Finally, the added components, reducing or inhibiting the diffusion of silver, are not limited to piezoelectric layers made of a PZT-type material.

BRIEF DESCRIPTION OF THE DRAWING

The FIGURE depicts a piezoelectric ceramic body in the form of a piezoceramic actuator having a layer sequence of piezoelectric insulating layers and silver-containing internal-electrode layers.

DETAILED DESCRIPTION

The FIGURE shows a design of piezoelectric ceramic body 5, generally known from German Patent Application No. 199 51 016.4, in a cuboid shape, having a multiplicity of sintered insulating layers 12 made of a generally known, piezoactive PZT ceramic, which are separated from each other in areas by sintered internal electrodes 13, 14, in the form of thin layers. The PZT ceramic has the composition, for example, $Pb(Ti_xZr_{1-x})O_3$ where $0.4<x<0.6$. The thickness of insulating layer 12, for example, amounts to 50 to 130 micrometers, given a typical number of 300 to 600; the thickness of internal electrodes 13, 14 is preferably between 500 nm and five micrometers, preferably at 1 to 2 micrometers.

The end faces of ceramic body 5 are also contacted, in a generally known manner, by two external electrodes 10, 11, opposite each other, metallic by way of example, and applied in a planar manner, first external electrode 10, at the assigned end faces of the cuboid, contacting first internal electrodes 13, and second external electrode 11, at the assigned end face of the cuboid, contacting second internal electrodes 14. Via external electrodes 10, 11, internal electrodes 13, 14 can be acted upon by a field intensity, which is typically between 1 kV/mm and 3 kV/mm, and in ceramic body 5, as a result of the inverse piezoelectric effect, an expansion or compression of insulating layers 12 results in the direction of the surface normals of insulating layers 12. Therefore, internal electrodes 13, 14 form the plates of a plate-type capacitor, having insulating layers 12 as the dielectric. For manufacturing ceramic body 5, ceramic green foils, designed to subsequently form insulating layers 12, are first manufactured in a generally known manner. The subsequent insulating layers, according to the manner depicted in the FIGURE, are then provided with a further foil in areas on one side, the foil being designed to constitute a subsequent internal electrode 13, 14. Alternatively, however, the material constituting subsequent internal electrodes 13, 14 can also be imprinted in areas onto the ceramic green foils using a silk-screen printing method. Then the green foil pairs, or the imprinted green foils, are stacked so as to be rotated 180° with respect to each other, yielding a periodic sequence of insulating layer 12, first internal electrode 13, insulating layer 12, second internal electrode 14, insulating layer 12, first internal electrode 13, etc. Lastly, the green body obtained in this manner is compacted in a die plate, or laminated, and is finally sintered at temperatures between 1000° C. and 1200° C., so that ceramic body 5 is produced.

After the sintering, finished ceramic body 5 is then usually polished externally and contacted to two end faces, situated opposite each other, having external electrodes 10, 11. Due to internal electrodes 13, 14, which alternatingly do not each extend to the end faces of ceramic body 5, first external electrode 10 only contacts first internal electrodes 13, and second external electrode 11 only contacts second internal electrodes 14.

Regarding the material of internal electrodes 13, 14, in the exemplary embodiment discussed, it is provided that they be made of a silver-palladium alloy, to which is also added a piezoelectric ceramic component. This piezoelectric ceramic component, in the concrete example, is a PZT ceramic, which preferably has the same composition as that of adjacent insulating layers 12. Overall, the proportion of the piezoelectric ceramic component in internal electrodes 13, 14 amounts to a maximum of 50 percent by volume, with respect to the entire volume of the material of internal electrodes 13, 14. The proportion of PZT ceramic in internal electrodes 13, 14 amounts to between 10 percent by volume and 30 percent by volume. As the silver-palladium alloy, it is expedient to use an alloy whose palladium content is as low as possible. It is preferred to use alloys having a proportion of less than 30 percent by mass palladium, preferably less than 20 percent by mass.

As the material for insulating layers 12 and as the piezoelectric ceramic component in internal electrodes 13, 14, the preferred choice is a PZT ceramic (lead-zirconate-titanate ceramic), to which dopant is also added at an order of magnitude of 2 mol % to 8 mol %. Recommended as dopants are rare-earth metals such as lanthanum or neodymium, subgroup elements such as niobium, tantalum, iron, or nickel, alkali metals such as sodium, potassium, or lithium, or alkaline-earth elements such as strontium.

In particular, internal electrodes 14, 15, in the example discussed, are made of an electrically conductive AgPd alloy in a mass ratio 85:15. To this AgPd alloy, a ceramic PZT material is added in the proportion of 20 percent by volume, which has had added to it as dopant 2 mol % $Sr(K_{0.25}Nb_{0.75})O_3$. Overall, this composition of internal electrodes 14, 15 can be sintered at temperatures below 1100° C. In this context, the internal-electrode material, in a generally known manner, is first manufactured as a paste.

What is claimed is:

1. A piezoelectric ceramic body comprising:
   a plurality of insulating layers situated one over the other, the insulating layers being composed of a piezoactive ceramic material; and
   internal electrodes separating at least portions of the insulating layers from each other, at least a part of at least one of the internal electrodes containing a silver-containing material, the material of the at least one internal electrode having a component which at least one of reduces and inhibits a diffusion of silver from the at least one internal electrode into an insulating layer.

2. The piezoelectric ceramic body according to claim 1, wherein the component contains a piezoelectric ceramic component.

3. The piezoelectric ceramic body according to claim 2, wherein the ceramic component includes $Pb(Ti_xZr_{1-x})O_3$, where $0.40<x<0.60$.

4. The piezoelectric ceramic body according to claim 1, wherein the material has an AgPd alloy as a main component.

5. The piezoelectric ceramic body according to claim 4, wherein the alloy contains at least 70 percent per mass Ag.

6. The piezoelectric ceramic body according to claim 1, wherein the component is present in a concentration of a maximum of 50 percent by volume, with respect to an overall volume of a material of the internal electrode.

7. The piezoelectric ceramic body according to claim 1, wherein the component contains at least one of:
   rare-earth metals including at least one of La and Nd;
   subgroup elements including at least one of Nb, Ta, Fe and Ni;
   alkali metals including at least one of Li, Na and K; and
   alkaline-earth metals including Sr.

8. The piezoelectric ceramic body according to claim 7, wherein the at least one of the rare-earth metals, the subgroup elements, the alkali metals and the alkaline-earth metals are used as dopants at a concentration of less than 8 Mol %, with respect to a material of the internal electrode.

9. The piezoelectric ceramic body comprising:
- a plurality of insulating layers situated one over the other, the insulating layers being composed of a piezoactive ceramic material; and
- internal electrodes separating at least portions of the insulating layers from each other, at least a part of at least one of the internal electrodes containing a silver-containing material, the material of the at least one internal electrode having a component which at least one of reduces and inhibits a diffusion of silver from the at least one internal electrode into an insulating layer;
- wherein the internal electrodes are electrically conductive and are composed of an AgPd alloy;
- and wherein the internal electrodes are further composed of a PZT ceramic modified by at least one of: rare-earth metal, subgroup elements, alkali metals and alkaline-earth metals.

* * * * *

UNITED STATES PATENT AND TRADEMARK OFFICE
CERTIFICATE OF CORRECTION

PATENT NO.   : 6,700,311 B2
DATED        : March 2, 2004
INVENTOR(S)  : Marianne Hammer et al.

It is certified that error appears in the above-identified patent and that said Letters Patent is hereby corrected as shown below:

<u>Column 4,</u>
Line 45, please change "layer." to -- layer; wherein the internal electrodes include a PZT ceramic modified by at least one of: rare-earth metals, subgroup elements, alkali metals and alkaline-earth metals. --

Signed and Sealed this

Twenty-eighth Day of June, 2005

JON W. DUDAS
*Director of the United States Patent and Trademark Office*